United States Patent [19]
Andersson et al.

[11] Patent Number: 5,838,807
[45] Date of Patent: Nov. 17, 1998

[54] TRIMMABLE VARIABLE COMPRESSION AMPLIFIER FOR HEARING AID

[75] Inventors: Olle Andersson, Jarfalla, Sweden; Jonas Weiland, La Jolla; Mehrdad Negahban, Irvine, both of Calif.

[73] Assignee: Mitel Semiconductor, Inc., San Diego, Calif.

[21] Appl. No.: 545,406

[22] Filed: Oct. 19, 1995

[51] Int. Cl.⁶ .................................. H04R 25/00
[52] U.S. Cl. ...................... 381/321; 381/312; 381/106
[58] Field of Search .................... 381/68, 68.2, 68.4, 381/106, 108, 109, 312, 317, 318, 320, 321, 107; 330/278, 282, 2, 254

[56] References Cited

U.S. PATENT DOCUMENTS

| | | | |
|---|---|---|---|
| 4,178,556 | 12/1979 | Attwood | 330/10 |
| 4,523,156 | 6/1985 | Sauer | 330/282 |
| 4,592,087 | 5/1986 | Killion | 681/68 |
| 4,595,885 | 6/1986 | Prieto et al. | 330/303 |
| 4,649,565 | 3/1987 | Kaizer et al. | 381/90 |
| 4,689,819 | 8/1987 | Killion | 381/68 |
| 4,724,398 | 2/1988 | Yokoyama . | |
| 4,731,850 | 3/1988 | Levitt et al. | 381/68.2 |
| 4,739,511 | 4/1988 | Hori et al. | 381/68 |
| 4,887,299 | 12/1989 | Cummins et al. | 381/68.4 |
| 4,888,810 | 12/1989 | Preves | 381/109 |
| 4,922,131 | 5/1990 | Anderson et al. | 307/355 |
| 4,934,770 | 6/1990 | Anderson et al. | 330/278 |
| 4,952,867 | 8/1990 | Anderson et al. . | |
| 4,982,317 | 1/1991 | Mauthe | 307/110 |
| 4,987,383 | 1/1991 | Mauthe | 330/254 |
| 5,083,312 | 1/1992 | Newton et al. | 381/68.4 |
| 5,111,506 | 5/1992 | Charpentier et al. | 381/68.4 |
| 5,117,201 | 5/1992 | Luther | 330/279 |
| 5,144,674 | 9/1992 | Meyer et al. | 381/68 |
| 5,247,581 | 9/1993 | Gurcan | 381/68.4 |
| 5,276,739 | 1/1994 | Krokstad et al. | 381/68.2 |
| 5,278,912 | 1/1994 | Waldhauer | 381/68.4 |
| 5,285,169 | 2/1994 | Theus | 330/254 |
| 5,317,640 | 5/1994 | Callias | 381/68.4 |
| 5,321,758 | 6/1994 | Charpentier et al. | 381/68.2 |
| 5,378,933 | 1/1995 | Pfannemueller et al. | 327/172 |
| 5,387,875 | 2/1995 | Tateno | 330/10 |
| 5,389,829 | 2/1995 | Milazzo | 327/172 |
| 5,410,265 | 4/1995 | Jain et al. | 330/2 |
| 5,410,592 | 4/1995 | Wagner et al. | 379/388 |
| 5,432,475 | 7/1995 | Fukahori | 330/254 |

FOREIGN PATENT DOCUMENTS

| | | |
|---|---|---|
| 0 481 528 A2 | 4/1992 | European Pat. Off. . |
| 0 498 197 A2 | 12/1992 | European Pat. Off. . |
| 0 498 197 A3 | 12/1992 | European Pat. Off. . |

OTHER PUBLICATIONS

R.S. Burwen, "Kilowatts on Order". *IEEE Spectrum*, pp. 32–37 (1993).

*Primary Examiner*—Huyen Le
*Attorney, Agent, or Firm*—Knobbe, Martens, Olson, & Bear, LLP

[57] ABSTRACT

An improved analog hearing aid is provided which incorporates a current source transconductance amplifier as an input stage. The gain defining bias current of the input stage transconductance amplifier is adjusted upon the application of battery power to the hearing aid to define a low input signal gain, and is then reduced by two gain regulators to define a compression threshold and compression ratio, and to provide a maximum output ceiling. Also provided is a method of trimming the low signal gain of the hearing aid at the time battery power is applied.

8 Claims, 12 Drawing Sheets

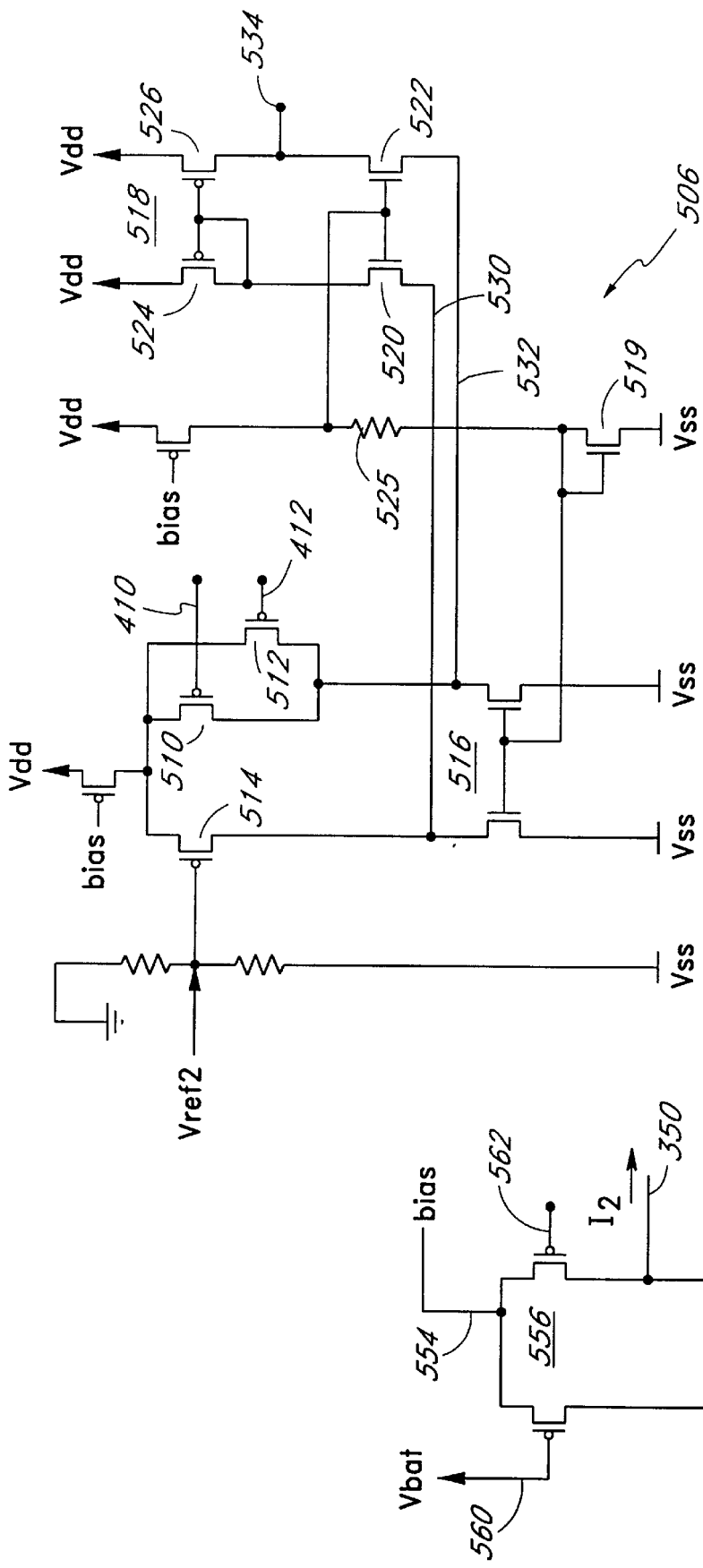

TRIMMABLE VARIABLE COMPRESSION AMPLIFIER FOR HEARING AID

BACKGROUND OF THE INVENTION

1. Field of the Invention

The present invention relates to audio amplifiers having a gain which is dependent on input signal level. Most particularly, the present invention relates to the use and implementation of such amplifiers in hearing aids.

2. The Prior Art

The development of a successful hearing aid circuit is constrained by many factors. Small size is important, especially for those devices which are intended to be worn entirely within the ear canal. Useful hearing aid circuitry is therefore preferably capable of incorporation on a single integrated circuit (IC). Because hearing aids are typically powered with a single 1.5 V cell, they should have low power requirements to maximize battery life. The hearing aid should also be capable of operating without a reduction in gain or audio output quality at the low battery voltages of 1.0 or 1.1 volts present near the end of a battery life. Furthermore, many circuit elements such as amplifiers, active filters, etc., function properly only over a dynamic signal range which is considerably less than that acoustically presented to the hearing aid user. Sound pressure levels at the hearing aid input transducer can vary over 110 or 120 Db from the threshold of audibility to the onset of uncomfortably loud volume. Circuit elements such as differential amplifiers, however, often do not have 120 Db of dynamic range before saturation. Preferably, therefore, distortion is reduced by limiting signal levels in the hearing aid so that high level inputs do not saturate the hearing aid amplification stages or other circuit elements.

It is also beneficial for a hearing aid amplifier to allow the tailoring of the input/output characteristics of the hearing aid to the pattern of hearing loss experienced by a particular patient. Some people experience a greatly decreased range between the threshold of sound audibility and the onset of unpleasant or even painful loudness. This may occur over the entire audio frequency spectrum, or be limited to particular frequency bands. The degree of audible range contraction relative to normal hearing will vary from patient to patient, and a successful hearing aid preferably provides means for modifying the audio output to provide characteristics especially suited for the particular user.

Various signal processing circuits have been utilized to provide appropriate gain regulation. For example, fully digital and hybrid analog/digital circuits have been designed, as shown in U.S. Pat. Nos. 5,276,739 to Krokstad et al., and 5,083,312 to Newton, et al. The benefit of such an approach is that modern digital signal processing algorithms may be used to process the audio input signal to, for example, limit output amplitude, provide different gains for different frequency bands, etc. However, the circuit required to implement such a scheme is complex, relatively expensive, and generally requires a large amount of power, even when implemented with CMOS technology.

In analog hearing aids, some signal processing is typically performed with a compression amplifier. These amplifiers have gain dependent on input signal level, and accordingly can be designed to provide appropriate signal limiting as described above. Particular hearing aid compression circuits are described in, for example, U.S. Pat. Nos. 4,393,770 to Anderson et al., and 5,278,912 to Waldhauer. Preferably, a compression amplifier should be designed to dissipate as little power as possible. Also, their performance is preferably consistent at both high and low battery voltages. Furthermore, independent control over compression threshold and compression ratio is desirable. Accordingly, a need exists for analog compression amplifier designs which provide these features, and are simple and inexpensive to implement on an integrated circuit.

SUMMARY OF THE INVENTION

The present invention relates to improved analog hearing aids which incorporate a current source transconductance amplifier as an input stage. Preferably the input stage transconductance amplifier is implemented with CMOS transistors which most preferably are operating in the weak inversion mode. In accordance with the present invention, the gain defining bias current of the input stage transconductance amplifier is reduced at high signal levels by gain regulators which define a compression threshold and compression ratio, and which also provide a maximum output ceiling. Preferably, the compression ratio and threshold, as well as the maximum output ceiling, are adjustable by the physician or audiologist or perhaps even the hearing aid user with adjustable resistors which are external to the hearing aid integrated circuit. Gain regulation is provided by relating the bias current of the transconductance amplifier input stage to a reference current source which is held constant when the hearing aid is in use. At high signal levels, the relation between the bias current and the reference current source is varied to vary the bias current and therefore the gain of the transconductance amplifier.

In a preferred embodiment, output of the transconductance amplifier provides the input to a current to voltage converter, and the output of the current to voltage converter is compared to two reference voltages by the gain regulators. A gain regulator also preferably compares the hearing aid output at the output transducer to a third reference voltage, and limits the output to a maximum value defined by the third reference voltage.

Also provided in accordance with the present invention is a method of trimming the low signal gain of the hearing aid at the time battery power is applied. In one preferred embodiment wherein the input stage transconductance amplifier provides an input to a current to voltage converter, both the feedback resistance of the current to voltage converter and the bias current of the transconductance amplifier are trimmed. The method includes the step of applying a reference input produced by an internal clock signal, and comparing the subsequent output with the second reference voltage mentioned above. The current in the reference current source is increased, thereby also increasing the bias current, until the output signal reaches the second reference voltage, with the reference current being held at that value by a latch during subsequent operation. Because the reference input level and the second reference voltage are both proportional to the battery voltage, initial gain settings are consistent, throughout the battery life.

BRIEF DESCRIPTION OF THE DRAWINGS

FIG. 4b is a schematic diagram of one logarithmic amplifier of the amplifier shown in FIG. 4a.

FIG. 4c is a schematic diagram of the variable current mirror and transconductance amplifier of the amplifier depicted in FIG. 4a.

FIG. 5b is a schematic diagram of one comparison circuit of the amplifier shown in FIG. 5a.

FIG. 5c is a schematic diagram of the output stage comparator of the amplifier shown in FIG. 5a.

DETAILED DESCRIPTION

The invention is best understood by reference to the Figures, wherein like parts are designated with like numerals throughout.

Figure 1:
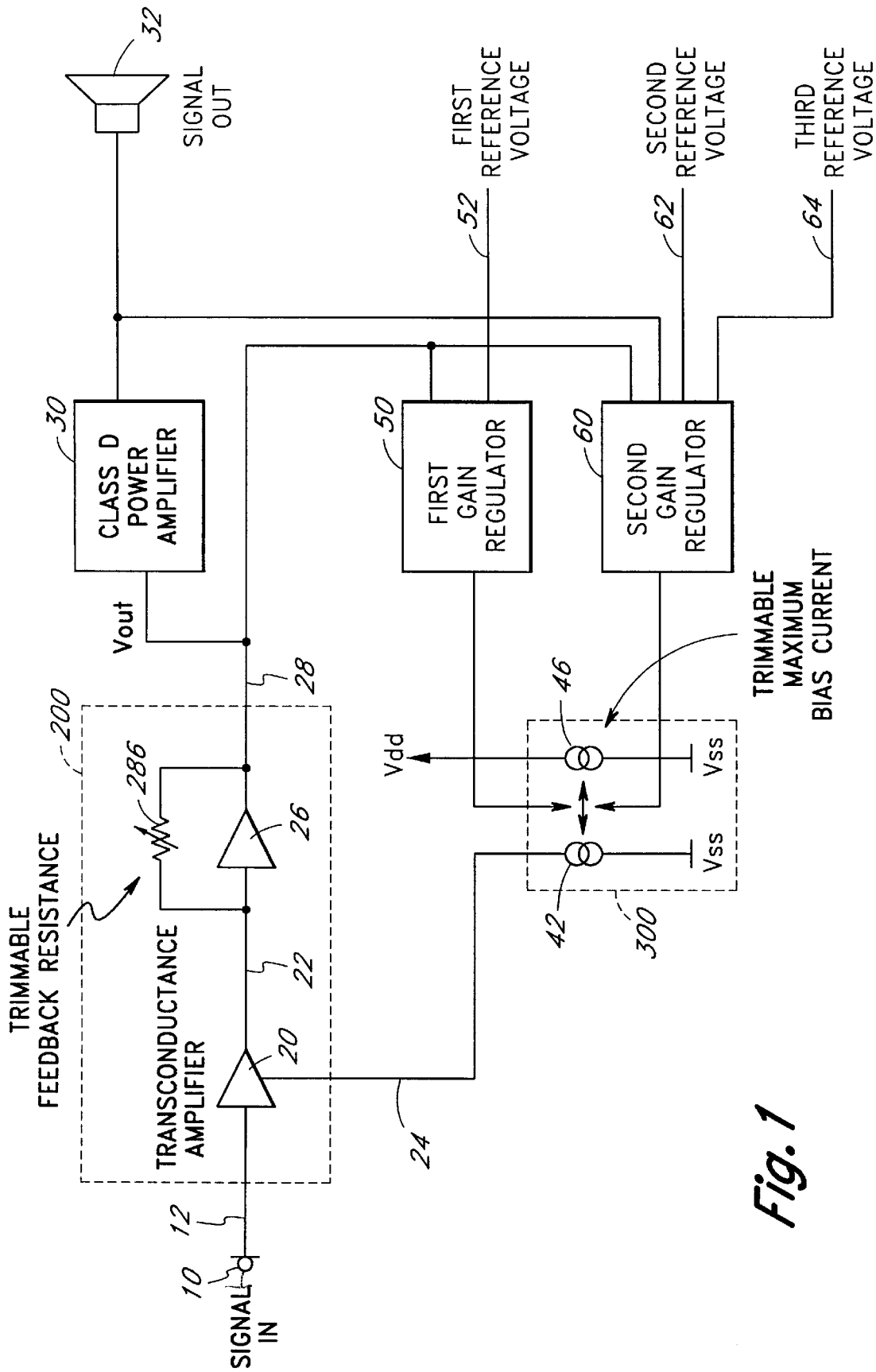
FIG. 1 is a block diagram of one presently preferred embodiment of the compression amplifier of the present invention, as incorporated into a hearing aid.

A preferred embodiment of the compression amplifier of the present invention is shown incorporated into a hearing aid in block diagram format in FIG. 1. Illustrated in FIG. 1 is an input transducer 10 such as a microphone for receiving the audio input to the hearing aid, with output connected to the input of an amplification circuit 200 which comprises a transconductance amplifier 20 as an input stage for audio amplification. It is one aspect of the present invention that the input stage is a true current source transconductance amplifier wherein output current at node 22 is proportional to the input signal level and the bias current fed to the transconductance amplifier through node 24. The output 22 of transconductance amplifier 20 is then fed to a second stage current to voltage converter 26, with output at node 28 providing the input to a power amplifier 30.

The power amplifier 30 may be of any type suitable for use in hearing aids. Preferably, however, the power amplifier 30 is a Class D pulse width modulation type as is described in the related U.S. patent application entitled "CLASS D HEARING AID AMPLIFIER WITH FEEDBACK" filed concurrently herewith and having the co-inventor of the present Application Olle Andersson as sole inventor. The disclosure of the "CLASS D HEARING AID AMPLIFIER WITH FEEDBACK" application is hereby incorporated by reference in its entirety. The output of amplifier 30 provides the input for an output transducer such as a speaker 32, which supplies the amplified signal to the ear.

Further provided in accordance with the present invention is a bias current control circuit 300, which is connected to the transconductance amplifier 20 through bias current node 24. The bias current is controlled by current source 42, which is related to the current supplied by a second current source 46. As will be explained in more detail below with reference to FIG. 8, current source 46 is adjustable, and is accordingly varied from a low initial value to a final setpoint during a trimming operation which sets the low signal gain of the transconductance amplifier 20.

After trimming, the current source 42 supplying the bias to transconductance amplifier 20 is controlled by altering the relation between current source 42 and current source 46 with a first gain regulator 50 and a second gain regulator 60. The output of the current to voltage converter 26 provides one input to the first gain regulator 50, with the other input being an adjustable reference voltage 52. As is explained in detail below, the first gain regulator 50 operates to supply a variable current which reduces the bias current supplied by current source 42 by an amount that is approximately directly proportional to the amount that the signal output from the current to voltage converter 26 at node 28 exceeds the reference voltage 52.

The second gain regulator 60 also has one input supplied by the output of current to voltage converter 26. In addition, the second gain regulator 60 has a second input connected to the output of the power amplifier 30, a third input supplied by a second reference voltage 62, and a fourth input supplied by a third reference voltage 64.

Similar to the first gain regulator 50, the second gain regulator 60 also operates to supply a current which reduces the bias current supplied to the transconductance amplifier 20. In contrast to the first gain regulator 50, however, the second gain regulator 60 operates substantially as an output limiter, reducing the gain of the transconductance amplifier 20 by the amount required to prevent the output of the current to voltage converter 26 and power amplifier 30 from exceeding a maximum value equal to the second and third reference levels 62, 64 respectively.

It can be appreciated therefore, that when the output of the 200 at node 28 is below the first reference voltage 52, neither of the gain regulators 50, 60 operates to reduce the bias current 24. The gain of amplifier 20, therefore, is determined by the current supplied by the current source 46, which has been set to a predetermined low signal level gain. As the output of the current to voltage converter 26 exceeds the level of the first reference voltage 52, the first gain regulator 50 begins to reduce the gain of the transconductance amplifier 20. If the output at node 28 further increases beyond the level of the second reference voltage, or if the output of the power amplifier 30 exceeds the level of the third reference voltage 64, second gain regulator 60 reduces the gain further, thereby limiting the output of both the amplification circuit 200 and the power amplifier 30.

A. Input Stage Transconductance Amplifier

Figure 2:
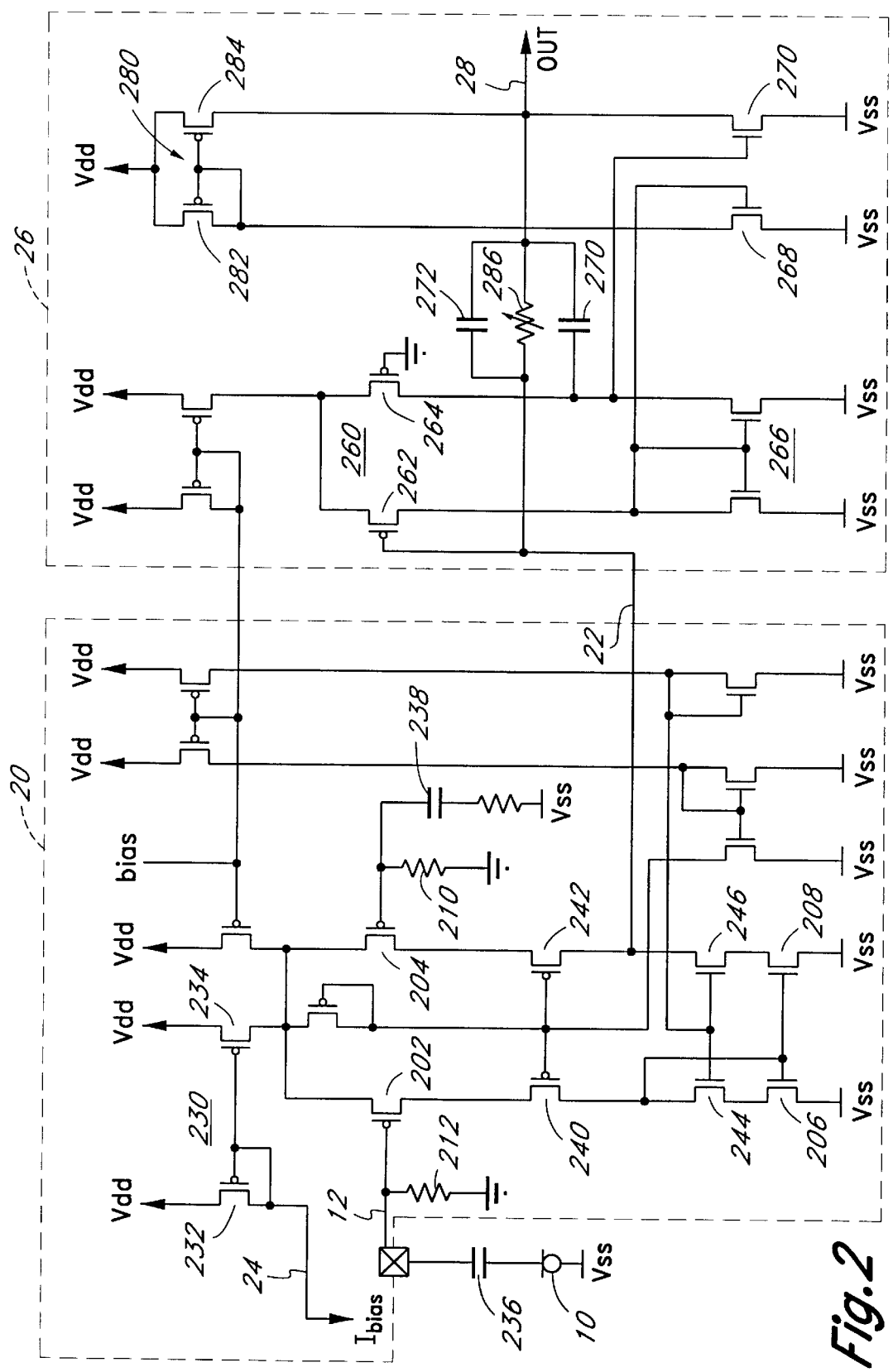
FIG. 2 is a schematic diagram of the input stage transconductance amplifier and current to voltage converter of the amplifier shown in FIG. 1.

FIG. 2 shows a schematic diagram of an input stage transconductance amplifier 20 according to the present invention. As is illustrated in FIG. 2, transconductance amplifier 20 comprises a differential pair of p-channel MOSFET transistors 202, 204 which feed a current mirror load of two n-channel MOSFET transistors 206, 208. The cascode transistors 240, 242, 244, and 246 are provided to increase the output impedance of the input stage.

Throughout this specification and in the Figures, power supply rails generated by the power supply are denoted by $V_{ss}$, which is tied to the negative battery terminal, and $V_{dd}$, which, via a voltage doubler circuit not shown, is approximately 2.0 to 2.9 Vdc (i.e. double the battery voltage of 1.0 to 1.5 volts minus approximately 0.1 volt). A signal ground is also provided by a voltage divider in the power supply, and is preferably held at approximately 0.86 times the battery voltage. Unless discussed otherwise, gate bias potentials are developed with local current mirrors in a manner well known to those in the art.

The signal input to amplifier 20 at node 12 is connected to the gate of a positive input p-channel MOSFET transistor 202. The gate of another p-channel MOSFET transistor 204, comprising the negative input to the transconductance amplifier 20 is tied to signal ground through a resistor 210.

Bias current is supplied to the differential pair 202, 204 by a p-channel transistor 234, which forms one half of a current mirror 230, formed by transistors 232 and 234. Current through transistor 232, which controls current through transistor 234, flows from the transconductance amplifier 20 at node 24, and is regulated as is described in detail below to control the gain of the transconductance amplifier 20.

It is one aspect of the present invention that the input stage transconductance amplifier 20 is implemented using CMOS transistors. Size constraints make CMOS useful as hearing aid amplifier circuitry because it is especially suitable for monolithic integration on a single integrated circuit. Preferably, wide channels are utilized so that the transistors 202, 204 operate in the subthreshold region where the transconductance, and therefore the gain, is substantially directly proportional to the DC current in the transistors. A MOSFET transistor operates in the subthreshold or weak inversion region when the current density is low, and is characterized by a drain current proportional to the exponent of the gate voltage, similar to a bipolar transistor. In this region, the transconductance is proportional to the current. In the strong inversion region, where channel current density is high, the transconductance is proportional to the square root of the current, and this region is accordingly less suitable for a variable gain amplifier. In a preferred embodiment therefore, current density is reduced by providing a total channel width for transistors 202 and 204 which ensures operation in weak inversion mode for the given bias current. In one embodiment, the channel width of the input differential pair 202, 204 is preferably at least 5 times that of subsequent stages, with approximately 1300 microns having been found suitable.

Furthermore, because of poor noise characteristics as compared to a bipolar input stage, CMOS technology has historically been considered generally unsuitable for use in analog hearing aid amplifiers. The higher noise of MOSFET amplifiers is generally associated 1/f noise caused by trapped charges in the interface between the silicon and the gate oxide. This noise is also reduced by increasing the area of the gates of the transistors 202, 204 forming the input differential pair. Therefore, increases in gate width sufficient to force operation in the weak inversion mode also reduce 1/f noise levels.

Noise from power supply fluctuations is reduced by capacitively coupling both differential inputs to $V_{ss}$ with capacitors 236 and 238, and also tying both differential inputs to signal ground with resistors 210 and 212. This ensures that noise between $V_{ss}$ and signal ground appears as a common mode input to the gates of both transistors 202 and 204 forming the differential pair.

B. Second Stage Current to Voltage Converter

As is also shown in FIG. 1, the output current of input transconductance amplifier at node 22 supplies the input to the current to voltage converter 26. Referring again to FIG. 2, the current to voltage converter 26 is preferably a two stage circuit with its input stage comprising a p-channel differential pair 260 formed by transistors 262 and 264 feeding an n-channel current mirror load 266. The gate of transistor 262 is connected to the output of the transconductance amplifier 20, and the gate of transistor 264 is connected to signal ground. The drains of the differential pair formed by transistors 262 and 264 are connected to the gates of second stage n-channel transistors 268 and 270. The output of transistor 268 accordingly determines the input current to a p-channel current mirror 280 which therefore acts as a current load for the output transistor 280.

A variable feedback resistance 286 is provided between the input to amplifier 26 at the gate of transistor 260 and the output of amplifier 26 at node 28, which is at the junction of the drain of transistor 270 and source of transistor 284. As will be explained in more detail below with reference to FIG. 7, feedback resistance 286 is adjustable, and is accordingly varied from an initial value to a final setpoint during a trimming operation which sets the gain of this second stage. During this trimming operation, resistance 286 is made to match a reference resistance external to the IC to help compensate for temperature and process variations in resistance values. Output node 28 comprises the signal output of compression amplifier 200, which, as illustrated in FIG. 1, comprises the input to power amplifier 30, which in turn drives output transducer 32.

C. Bias Current Source for Input Transconductance Amplifier

Figure 3:
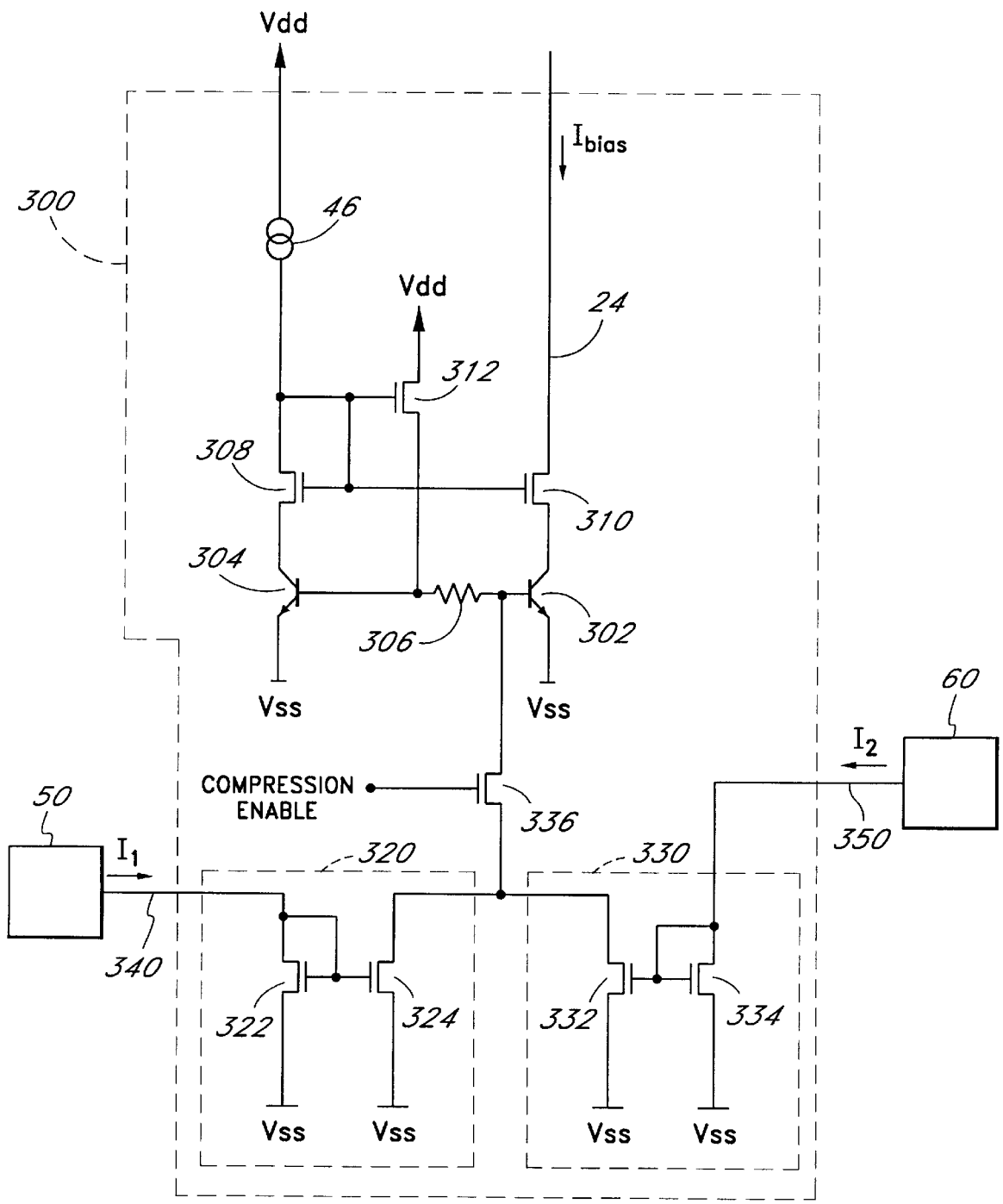
FIG. 3 is a schematic diagram of the current source regulator circuit of the amplifier shown in FIG. 1.

FIG. 3 is a more detailed schematic of the bias current source for the transconductance amplifier 20 and the circuit which regulates it. As is shown in FIG. 3, the bias current through node 24 and n-channel MOSFET 310 is driven by a bipolar n-p-n transistor 302 with emitter tied to $V_{ss}$. The base of the bipolar transistor 302 is connected through a resistor 306 to the base of another bipolar n-p-n transistor 304, which also has its emitter tied to $V_{ss}$. Base current is supplied directly to the base of transistor 304 by the source of an n-channel MOSFET 312 with its drain tied to $V_{dd}$, and with gate common to n-channel MOSFETs 308 and 310 provided in series with bipolar transistors 304 and 302 respectively, thereby holding the base to emitter voltage of transistor 304 substantially constant. This MOSFET 312 also supplies base current to the other bipolar transistor 302, but does so through the resistor 306, thus forming an "unbalanced" current mirror with transistors 302 and 304, wherein the degree of imbalance between the currents sourced by transistors 302 and 304 is dependent on the voltage drop across the resistor 306 between their bases.

This voltage drop across the resistor 306 is regulated by current mirrors 320 and 330. Current mirror 320 is formed by n-channel MOSFET transistors 322 and 324, with the drain of transistor 324 connected between one side of resistor 306 and the base of transistor 302. Similarly, current mirror 330 is formed by n-channel MOSFET transistors 332 and 334, with the drain of transistor 324 connected between one side of resistor 306 and the base of transistor 302. The drain of transistor 322 is tied to the output of the first gain regulator 50 at node 340, and the drain of transistor 334 is connected to the output of second gain regulator 60, at node 350.

Preferably, an n-channel MOSFET enable switch 336 is provided between the transistor 302 base/resistor 306 junction, and the common input to current mirrors 320 and 330. As will be described in detail below, this allows the low signal gain of the transconductance amplifier 20 to be set with the variable current source 46.

It can be appreciated, therefore that current flowing from the gain regulators 50 and 60 into current mirrors 320 and 330 will pull current from transistor 312 through resistor 306, thereby lowering the base voltage of bipolar transistor 302 relative to bipolar transistor 304. This will reduce the transconductance amplifier 20 bias current through transistor 302 relative to the constant current through transistor 304, thereby reducing the gain of input transconductance amplifier 20. The mechanism for injecting current into current mirrors 320 and 330 is described in detail in the next section.

D. Bias Current Source Regulators

Figure 4A:
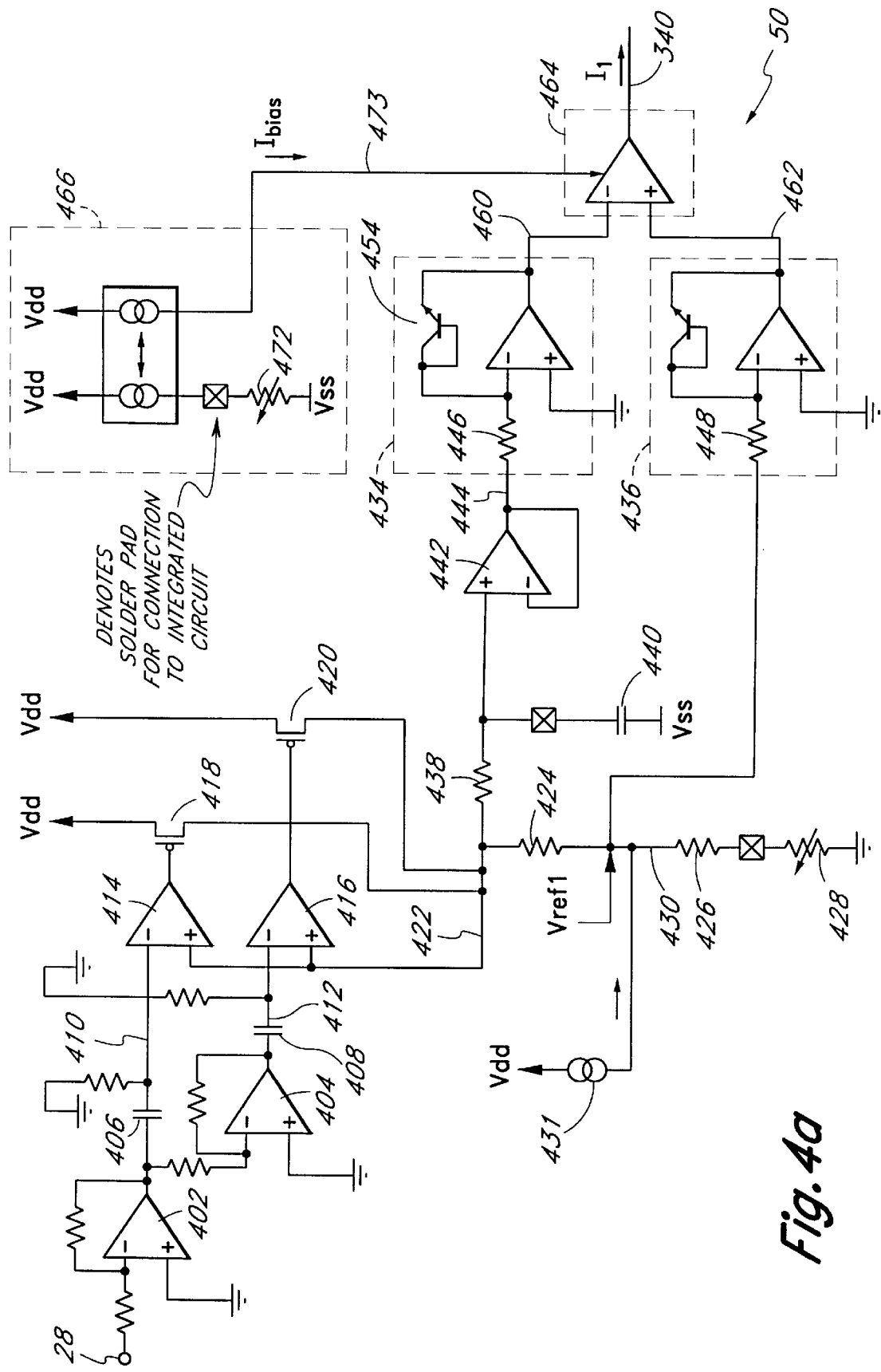
FIG. 4a is a schematic diagram of the first gain regulator of the amplifier of FIG. 1.

FIG. 4a is an illustration of a preferred embodiment of the first gain regulator shown in FIGS. 1 and 3. In this embodiment, the gain regulator 50 receives as an input the output of the current to voltage converter 26 at node 28. The input signal enters an inverting operational amplifier 402 with a fixed gain of preferably approximately one to two. The output of operational amplifier 402 enters a second inverting operational amplifier 404, which is provided with unity gain. The outputs of amplifiers 402 and 404 connect to DC blocking capacitors 406 and 408 respectively, producing an AC coupled signal and its inverse at nodes 410 and 412. These two nodes 410, 412 provide negative inputs to two additional operational amplifiers 414, 416, each with its output connected to the gate of a p-channel MOSFET 418, 420. The two MOSFETs 418, 420 have common drains which are connected to $V_{dd}$, and common sources at node 422 which are fed back to the positive inputs of amplifiers 414 and 416. The common sources of transistors 418 and 420 at node 422 are connected to signal ground through three resistors 424, 426, and 428 which are connected in series. The last resistor 428 of this series, having one side tied to signal ground, is variable. Furthermore, a constant current input is forced from node 430 at the junction of resistor 424 and 426 to signal ground through resistors 426 and 428. The current source 431 can be created in a variety of ways, with a simple resistive circuit producing a current proportional to the battery voltage having been found to be suitable. By varying the resistance of variable resistor 428, the voltage at node 430, denoted $V_{ref1}$, can accordingly be varied.

It can be seen that if the signal at nodes 410 and 412 comprising the negative inputs of amplifiers 414 and 416 is lower than $V_{ref1}$, resistor 424 will pull node 422 up to $V_{ref1}$, and transistors 418 and 420 will be biased off by positively saturated amplifiers 414 and 416. However, if the signal at either node 410 or 412 rises above $V_{ref1}$, the voltage at node 422 will follow. Node 422, connected to one side of resistor 424, therefore tracks signal excursions above $V_{ref1}$, but never falls below $V_{ref1}$. Node 430, connected to the other side of resistor 424 is held at the constant $V_{ref1}$. In other words, the potential across the resistor 424 equals the amount that the voltage of the output signal from current to voltage converter 26 exceeds $V_{ref1}$.

Resistor 424 is connected through node 422 to a low pass filter formed by resistor 438 and capacitor 440. The capacitor 440 may be provided external to the integrated circuit. This RC network provides a peak detection attack time of preferably about 1 msec, and a release time additionally dependent on the value of the resistor 424 which is preferably approximately 25 or 30 msec. After passing through a follower 442, the signal from node 422 enters logarithmic amplifier 434 at node 444. The constant voltage $V_{ref1}$ at node 430 provides an input to a second logarithmic amplifier 436. The logarithmic amplifiers 434 and 436 are schematically identical except for input resistors 446 and 448. For reasons explained in more detail below, it is preferable for the input resistance 446 of the logarithmic amplifier 434 connected to the signal input node 422 to be slightly higher than the input resistance 448 of the logarithmic amplifier 436 connected to $V_{ref1}$ at node 430.

Figure 4B:
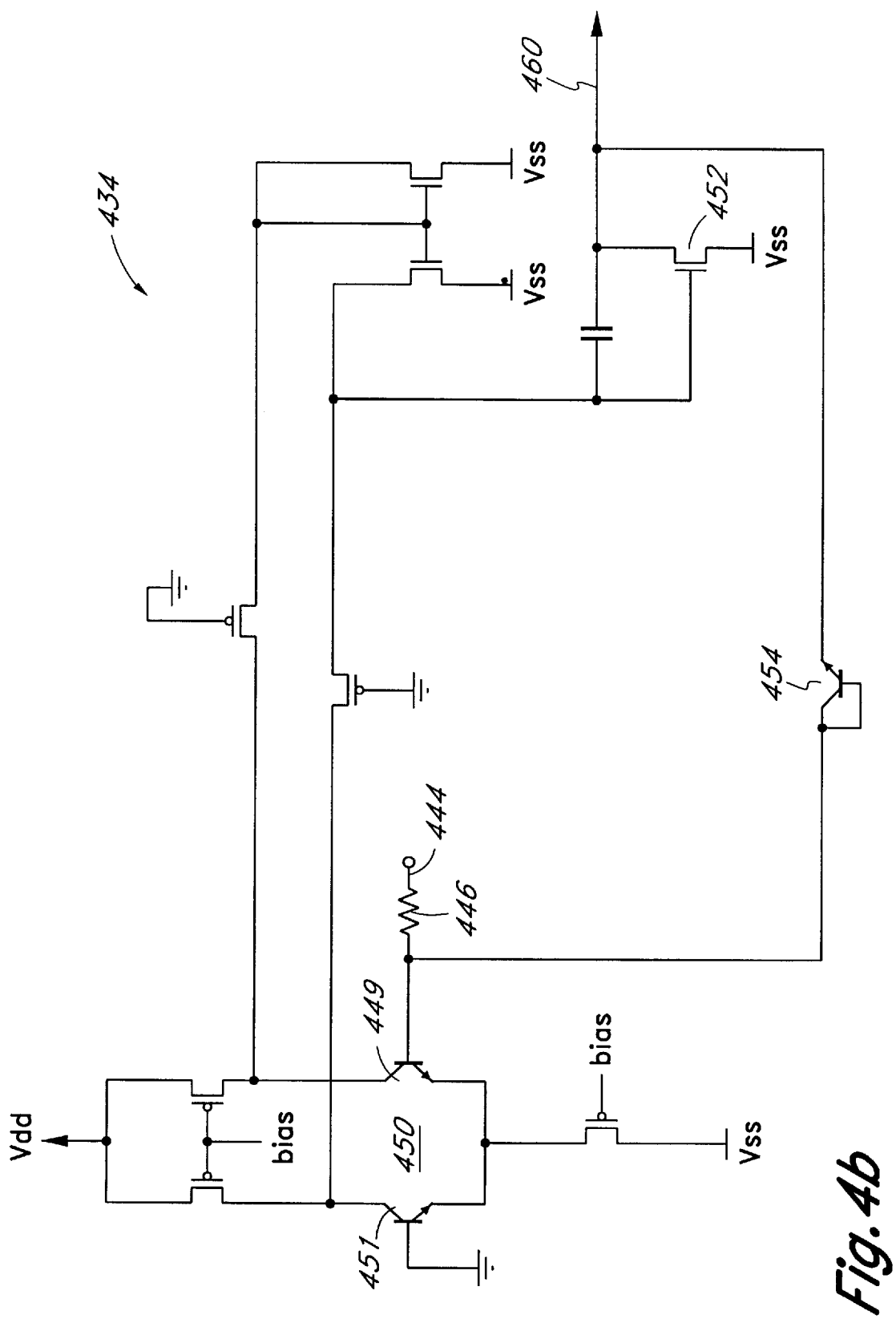

A schematic of logarithmic amplifier 434 is shown in FIG. 4b. The input at node 444 is presented to resistor 446, and then passes to the base of one transistor 449 of a differential pair 450, and to the common base and collector of a diode connected feedback transistor 454. The base of the transistor 451 forming the other half of the differential pair 450 is tied to signal ground. Differential amplifier action will result in the voltage at the input node 444 appearing across input resistor 446, with the resulting current passing through the feedback transistor 454 to the output node 460, which will be held by n-channel MOSFET transistor 452 at a potential below signal ground which is logarithmically related to the input voltage at node 444.

Referring again to FIG. 4a described above, for signal levels below $V_{ref1}$ the potential relative to signal ground at the inputs to both logarithmic amplifiers 434 and 436 at nodes 444 and 430 respectively is identical and is equal to $V_{ref1}$. If the amplifiers 434, 436 were identical, this would produce equal output voltages at amplifier output nodes 460 and 462 as well. Preferably, however, resistor 446 has approximately a 10% to 30% higher resistance value than resistor 448, reducing the gain of the logarithmic amplifier 434, and therefore raising slightly the potential of its output node 460 relative to the output node 462 of the other logarithmic amplifier 436.

Output nodes 460 and 462 of the logarithmic amplifiers 434, 436 form differential inputs to a second transconductance amplifier 464, which has a gain dependent on the bias current supplied to it by a variable current source 466. The output of this amplifier 464, which it can now be appreciated will be dependent on the output signal of current to voltage converter 26 relative to $V_{ref1}$, feeds current mirror 320 from output node 340 as is shown in FIG. 3.

Figure 4C:
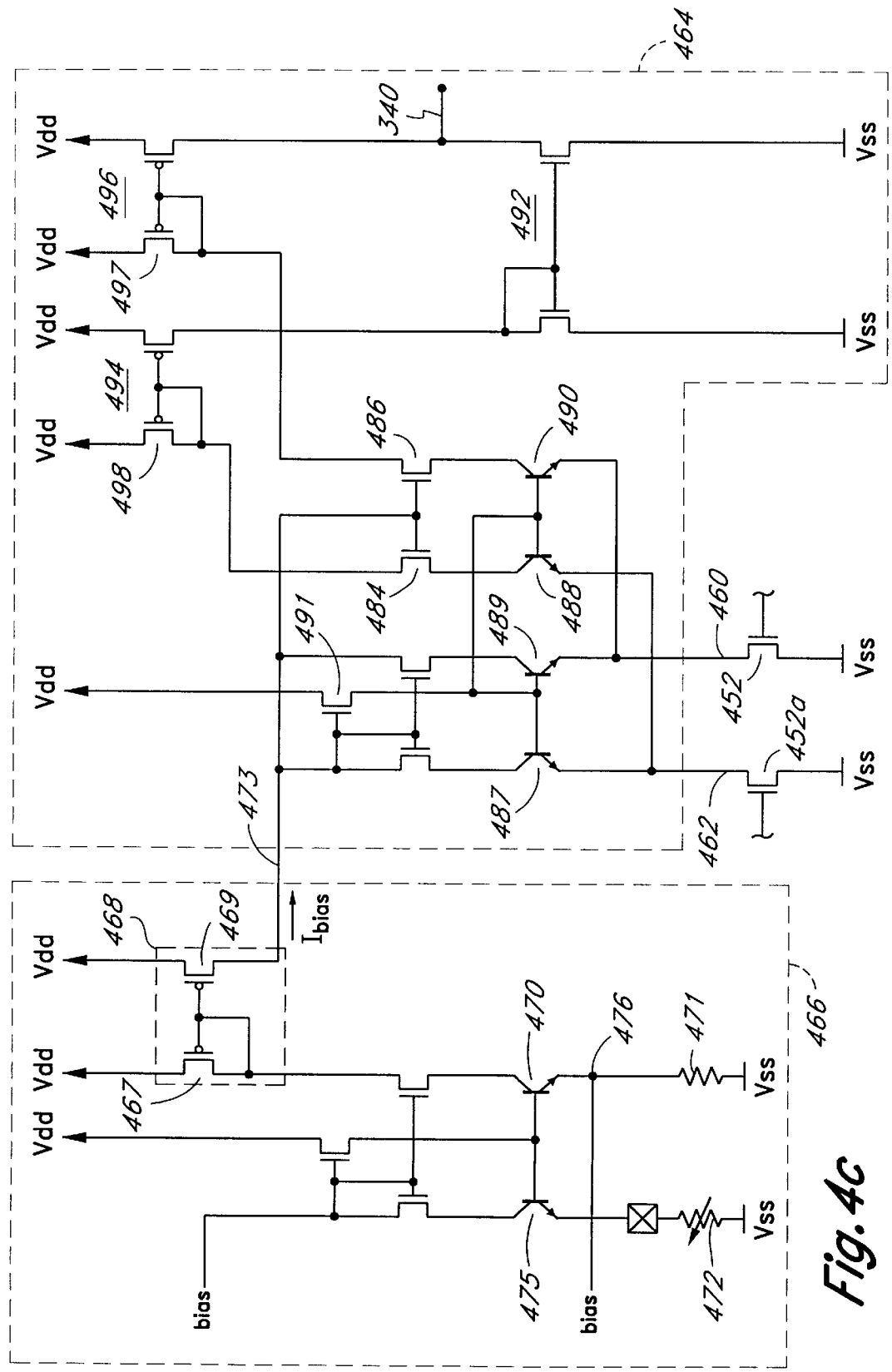

A schematic diagram of a preferred embodiment of this amplifier 464 and its bias current source 466 are provided in FIG. 4c. Bias current for this transconductance amplifier 464 through node 473 is generated in current source 466 by current mirror 468, made up of two p-channel MOSFETs 467, 469. Current through current mirror 468 is determined by current through a bipolar transistor 470, which is tied to $V_{ss}$ through a resistor 471. The base of transistor 470 is tied to the base of another bipolar transistor 475, which is tied to $V_{ss}$ through an external variable resistor 472. It can be appreciated that reductions in the resistance of the adjustable resistor 472 will reduce the voltage on the base of transistor 470, and will therefore reduce the current through transistor 470, and in turn, the current through current mirror 468. Preferably, a small bias current is injected into the resistor 471 at node 476 to bias transistor 470 completely off when the adjustable resistor 472 is approaches its minimum resistance. The bias current from current mirror 468 through node 473 is split between two bipolar transistors 487, 489 having common bases which are connected to a feedback MOSFET 491 with drain connected to $V_{dd}$ and source connected to the bases of the bipolar transistors 487, 489. The potential of node 473 provides a bias voltage for the gates of cascode n-channel MOSFETs 484 and 486.

Two additional bipolar transistors are also provided. Transistor 488 is configured to have a common base and emitter with transistor 487, and transistor 490 is configured to have a common base and emitter with transistor 489. Consequently, the current in transistor 488 is approximately equal to that in transistor 487, and the current in transistor 490 is approximately equal to that in transistor 489. The current through bipolar transistors 488 and 490, and therefore the transconductance of the input stage of amplifier 464 connected to nodes 460 and 462 will be proportional to the bias current through node 473.

Differences in voltage between nodes 460 and 462 will therefore produce differences in current through transistors 488 and 490 with the current through transistor 488 controlling the current in current mirrors 494 and 492. The current through transistor 490 drives the current in current mirror 496, with the result that the current output at node 340 is substantially proportional to the bias current at node 473 and the voltage difference between node 460 and node 462.

It may also be recalled that at signal levels below $V_{ref1}$, transistor 452a is biased on slightly more than transistor 452 because of the different resistance of resistors 448 and 446 shown in FIG. 4a. In low signal operation therefore, output node 340 is held near $V_{ss}$, and no output current flows through current mirror 320. When the signal input at node 444 increases above $V_{ref1}$, however, transistor 452 lowers the potential at node 460, increasing the current through transistor 497 over the amount that travels through transistor 498, with the excess current being forced out at node 340 by n-channel current mirror 492. In this way, the bias current of input stage transconductance amplifier 20 is reduced when the signal output from current to voltage converter 26 exceeds $V_{ref1}$.

As is illustrated in FIG. 1, a second gain regulator 60 is also provided which regulates the gain of input transconductance amplifier 20. A schematic of one preferred embodiment of second gain regulator 60 appears in FIG. 5a. The purpose of the second gain regulator 60 is to prevent the saturation of amplifiers 20 and 26, and also to prevent the signal at speaker 32 from exceeding a pre-set threshold. To accomplish this, two additional reference voltages are generated with resistive voltage dividers 502 and 504.

Figure 5A:
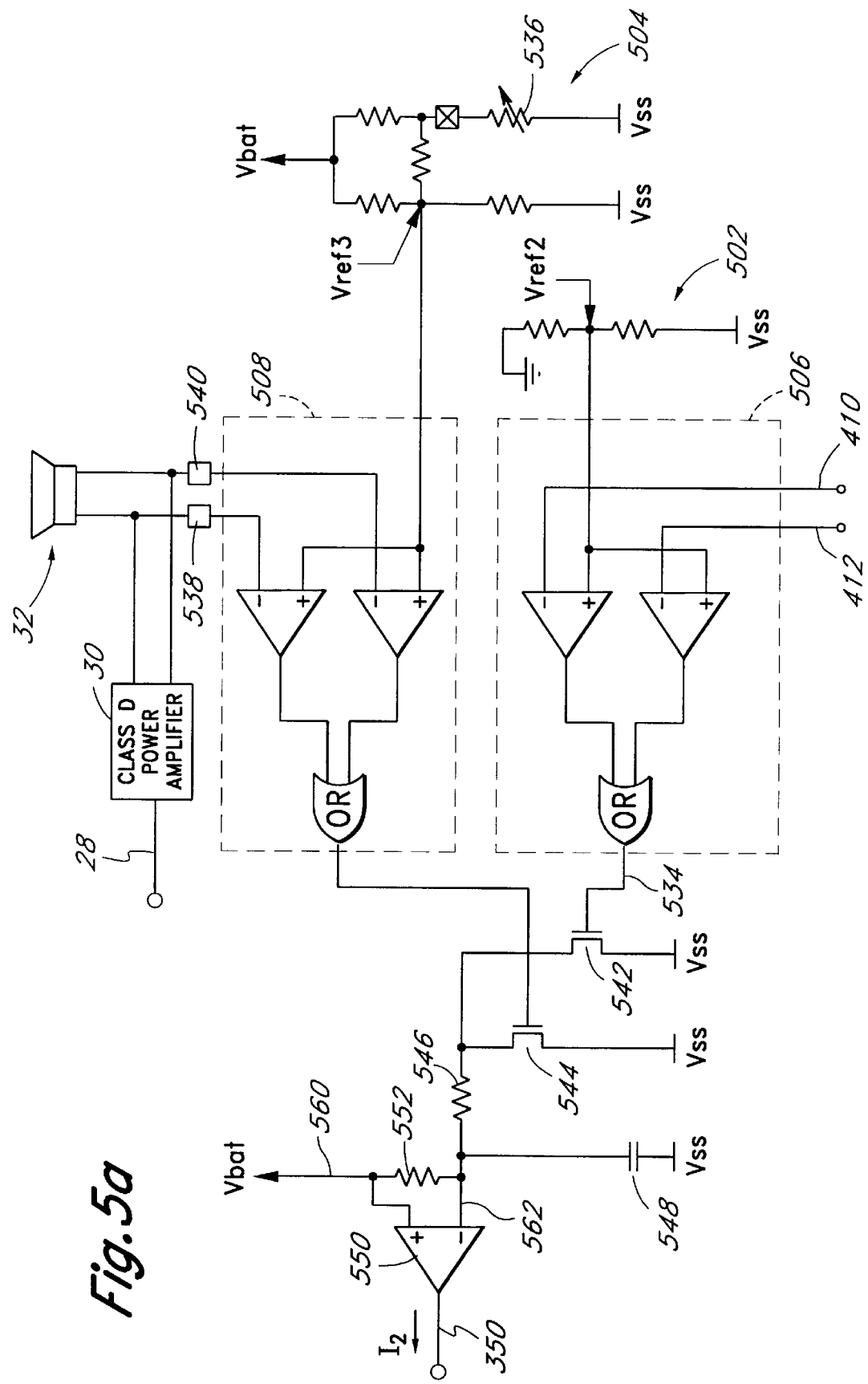
FIG. 5a is a schematic diagram of the second gain regulator of the amplifier shown in FIG. 1.

As seen in FIG. 5a, voltage divider 502 produces a reference voltage $V_{ref2}$, which is near $V_{ss}$, preferably at approximately 0.1 to 0.2 times the battery voltage $V_{bat}$. $V_{ref2}$ provides one input to a comparison circuit 506, which can be represented logically as two comparators with outputs that provide the input to an OR gate. Also providing inputs to this comparison circuit are nodes 410 and 412, which, as described above in conjunction with FIG. 4a and first gain regulator 50, are proportional to the signal output of the current to voltage converter 26 and its inverse (they are equal to the signal output and its inverse if amplifier 402 has a unity gain).

A schematic of a preferred comparison circuit 506 is shown in FIG. 5b. Referring to that Figure, it is seen that nodes 410 and 412 are connected to the gates of p-channel MOSFET transistors 510 and 512, which in combination form a differential "pair" with p-channel MOSFET transistor 514, which has its gate tied to $V_{ref2}$.

The input stage of the comparator 506 is a folded cascode type. The voltage drop across resistor 525 (and transistor 519) defines the gate voltage of transistors 520 and 522, and the current through transistors 520 and 522 define the voltages at nodes 530 and 532 relative to that gate voltage.

The current in transistor 520 will be the current through current mirror 516 which is fixed by the current through transistor 519 minus the current through the comparator input transistor 514. Similarly, the current in transistor 522 will be the current through current mirror 516 minus the combined current through the comparator input transistors 510 and 512. If the current in transistor 520 is larger than the current in transistor 522, the output of the comparator at node 534 will be pulled to $V_{dd}$. If the current in transistor 522 is larger than the current in transistor 520, the output of the comparator at node 534 will be pulled to $V_{ss}$.

Schematically, the other comparison circuit 508 shown in FIG. 5a is identical to that shown in FIG. 5b. However, the voltage reference created by voltage divider 504, $V_{ref3}$, is preferably made adjustable with variable resistor 536 from a lower limit of about 0.05 to 0.1 times $V_{bat}$, to an upper limit of just below 0.5 times $V_{bat}$. Furthermore, the signal inputs to comparison circuit 508 are from the output of the hearing aid power amplifier 30 which powers the output transducer 32. If the power amplifier 30 is a Class D pulse width modulation type, the inputs must be low pass filtered with filters 538 and 540 to reconstitute the audio frequency output signal. Adjustability of $V_{ref3}$ via resistor 536 is provided for the convenience of the hearing aid user. With resistor 536, the maximum output from receiver 32 can be made comfortable for a particular hearing aid wearer. With those differences in inputs, operation of comparison circuit 508 is identical to that described with reference to comparison circuit 506 and FIG. 5a.

The output of each comparison circuit 506, 508 drives the gate of an n-channel MOSFET 542, 544, each with its source tied to $V_{ss}$ and drain tied to the negative input of another comparator 550, through a low pass filter formed by a series resistor 546 and capacitor 548, substantially as described with respect to resistor 438 and capacitor 440 shown in FIG. 4a, but which preferably provides output limiting at 1.5 dB per msec, with a release time of approximately 100 msec.

The positive input at node 560 to the amplifier 550 is tied to $V_{bat}$. The negative input at node 562 is also tied to $V_{bat}$ through a resistor 552 which holds both inputs at $V_{bat}$ when input signals to comparison circuit 506 are less than $V_{ref2}$, and input signals to comparison circuit 508 are less than $V_{ref3}$. When either transistor 542 or 544 is forced on by the comparison circuit 506 or 508, the negative input to comparator 550 is pulled toward $V_{ss}$, resulting in a positive output at output node 350, which feeds current mirror 330 shown in FIG. 3.

As is shown in FIG. 5c, amplifier 550 is preferably simply a differential pair 556 of p-channel MOSFETs feeding an n-channel MOSFET current mirror load 558. Amplifier 550 will source at most the bias current input at node 554. If this bias current times the resistance 306 connected to the base of transistor 302 is large enough (preferably at least about 50 mV), gain regulator 60 will operate essentially as an output limiter, and will source whatever current is necessary to clip voltage excursions at the output of the current to voltage converter 26 beyond $V_{ref2}$, as well as voltage excursions at the output of the power amplifier 30 beyond $V_{ref3}$.

Figure 6:
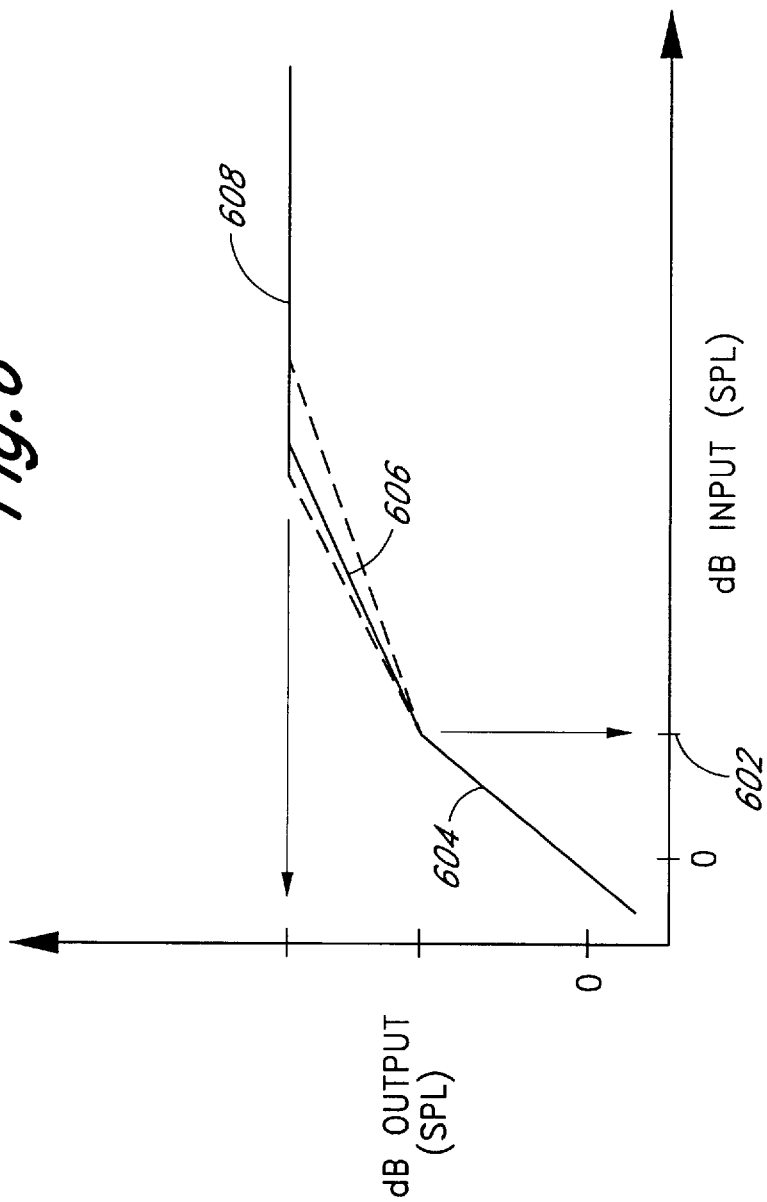
FIG. 6 is a graphical representation of output signal as a function of input signal of a compression amplifier according to the present invention.

A graphical illustration of dB output at the output transducer as a function of dB input which is produced by the gain regulation of the present invention is illustrated in FIG. 6. At input signal levels below a certain threshold 602 which produce an output at node 28 of less than $V_{ref1}$, the gain defined by the bias current of the input transconductance amplifier 20 is unmodified by the gain regulators 50, 60. This is illustrated in region 604 of FIG. 6. Once node 28 exceeds $V_{ref1}$, the first gain regulator 50 begins to reduce the bias current of the input transconductance amplifier, thereby producing a slope reduction in the next region of the curve 606. With examination of the circuit shown in FIG. 4a it can be seen that the current from node 340 will be proportional to the logarithm of $[V_{ref1}/V_{node\ 422}]^N$, where N is dependent on the bias current at node 473 and the gain of the logarithmic amplifiers 434, 436. Because the emitter current of transistor 302 is exponentially dependent on its base voltage, the bias current at node 24 is therefore proportional to $[V_{ref1}/V_{node\ 422}]^N$. As explained above, when the output at node 28 is less than $V_{ref1}$, $V_{node\ 422}$ is equal to $V_{ref1}$. When $V_{node\ 422}$ exceeds $V_{ref1}$, however, the bias current (and therefore the amplifier 20 gain) becomes reduced by the factor $[V_{ref1}/V_{node\ 422}]^N$, thereby producing the reduced slope region 606.

At higher input signal levels, either the voltage at node 28 exceeds $V_{ref2}$ or the voltage at the output transducer 32 exceeds $V_{ref3}$ the output is clamped by the second gain regulator 60, producing a output signal ceiling for high input signals, shown as region 608 in FIG. 6.

The adjustability of gain characteristics provided as one aspect of the present invention may now be appreciated. The slope of region 604 is determined by the initial low signal bias current of the input transconductance amplifier 20. It has been found suitable in a preferred embodiment of this invention to set the low signal input/output relationship at 1:1 with a trimming procedure described in detail in the next section. The input level which defines the compression threshold point 602 is variable by varying the resistance of resistor 428 in the first gain regulator circuit illustrated in FIG. 4a. This resistor, it may be recalled by reference to that Figure, defines the voltage $V_{ref1}$. Furthermore, the slope in region 606 of the curve of FIG. 6 is dependent on the gain of the transconductance amplifier 464 in the first gain regulator 50 circuit shown in FIG. 4a. As was explained above, this gain is set by external adjustable resistor 472 shown in FIG. 4c, and may therefore the slope of region 606 may also be varied. Finally, the output ceiling level, shown as region 608 of FIG. 6, is also variable with external adjustable resistor 536 illustrated in and described above with reference to FIG. 5a.

E. Gain Trimming Operation

It is another beneficial aspect of the present invention that gain trimming to a pre-set value operative for low signal inputs may be periodically performed. Preferably, a gain trim operation is performed automatically each time power is applied to the hearing aid.

As can be seen in FIG. 1, the total gain of the amplification section 200 is governed by the bias current of the input transconductance amplifier 20 and the feedback resistance 286 of the current to voltage converter 26. In a preferred embodiment, two separate trimming operations are performed, one for the feedback resistor 286, and one for the bias current of the input transconductance amplifier 20.

This trimming operation is best explained with reference to FIGS. 7, 8 and 9. First, the feedback resistance 286 of the current to voltage converter 26 is set by locking its value to match a precision (preferably 1% tolerance) resistor 712 shown in FIG. 7 which is external to the integrated circuit. This improves hearing aid performance because the resistance value of feedback resistor 286 which is integrated onto the chip is difficult to precisely control, and if not adjustable, will vary with temperature and also from chip to chip due to process variations.

Second, the bias current of the transconductance amplifier 20 is set at a value to define the transconductance amplifier 20 gain at low input signal levels. The actual value of the bias current at any given moment is affected by signal level through the action of the first and second gain regulators 50 and 60 in the manner described above. The low signal gain is preferably set in a manner which ensures an identical initial gain setting with each power up, it being especially beneficial that the low signal gain setting produced by the trim operation does not vary with decreased battery voltage.

Figure 7:
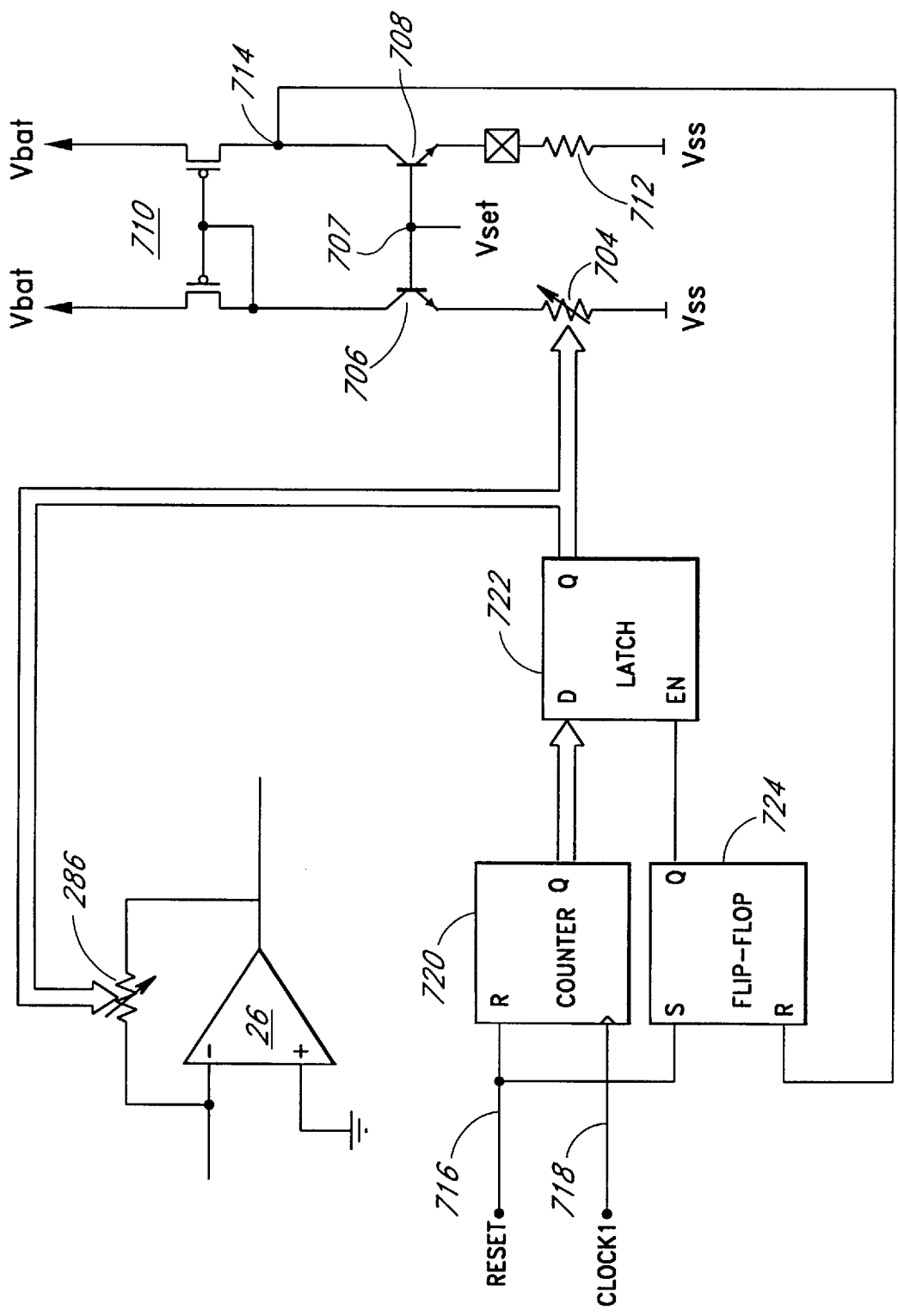
FIG. 7 is a block diagram of a circuit which may be used to trim the feedback resistance of the current to voltage converter of the amplifier of FIG. 1.
Figure 9:
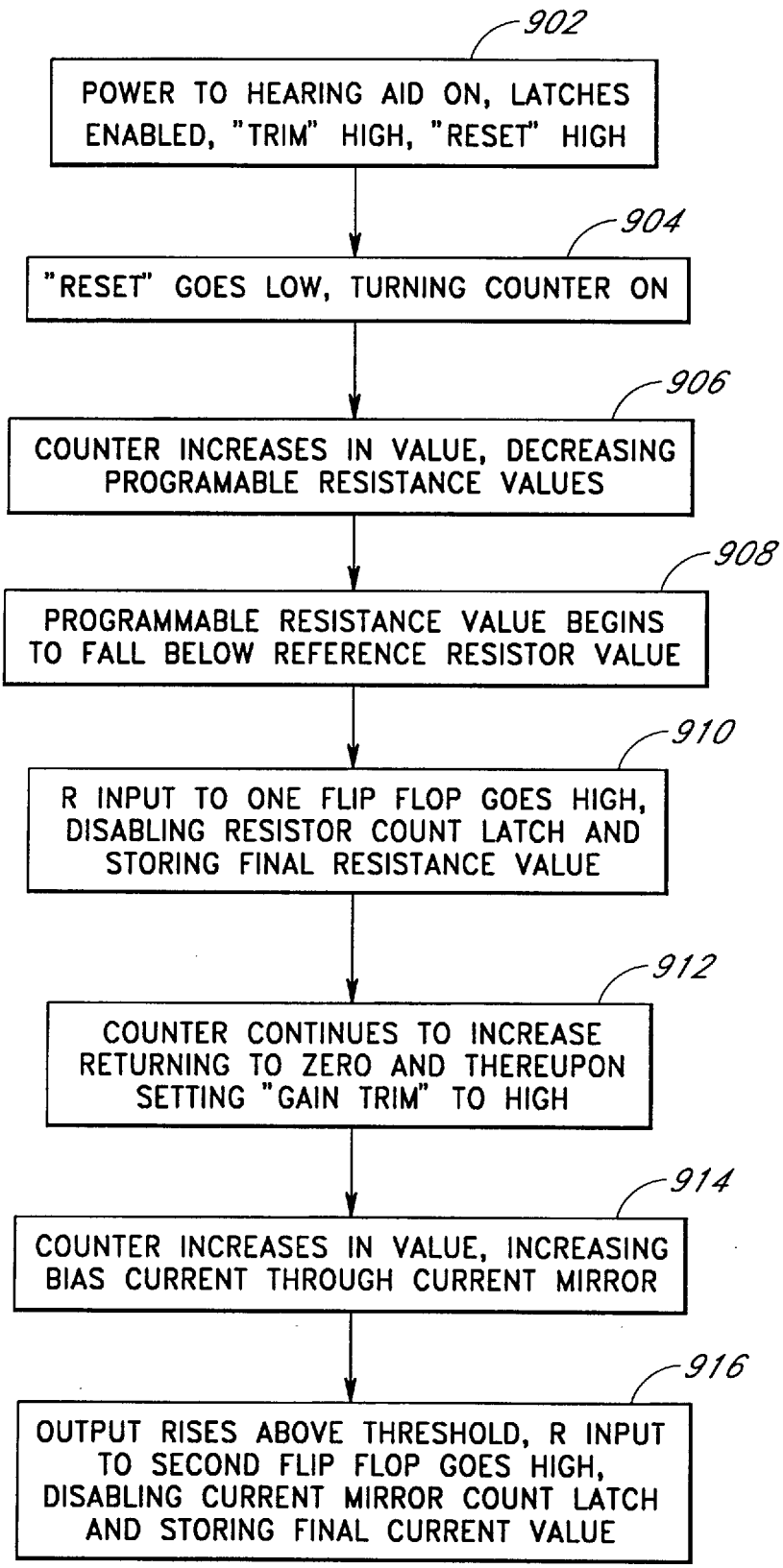
FIG. 9 is a flow diagram illustrating the sequence of steps utilized to set the low signal input amplifier gain.

A preferred circuit for accomplishing a trim operation of the feedback resistor 286 of the current to voltage converter 26 is shown in FIG. 7, and is also outlined in the first five steps illustrated in the flowchart of FIG. 9. Referring now to FIGS. 7 and 9, feedback resistor 286 is made to be digitally adjustable in 16 steps with four high/low inputs using techniques well known to those of skill in the art. In a preferred embodiment, the target resistance of feedback resistor 286 is 400kohms, and the stepwise adjustment varies the resistance value from approximately 250kohm to approximately 550kohm. A separate identical digitally adjustable resistor 704 is also provided, with one end tied to $V_{ss}$, and the other end connected to a constant voltage supplied by a bipolar transistor 706. The same voltage is applied across the precision reference resistor 712 which is external to the IC by another bipolar transistor 708 having a common base with transistor 706, wherein both bases are held at a constant voltage $V_{set}$ 707 generated with a resistive divider from $V_{bat}$. Both transistors 706 and 708 are fed by a p-channel current mirror 710 such that the voltage at node 714 is held near $V_{ss}$ when the resistance of resistor 704 is higher than the resistance of the external reference resistor 712, and the voltage at node 714 is pulled to $V_{bat}$ when the resistance of resistor 704 is lower than the resistance of the external reference resistor 712.

The resistor trim sequence is thus completed with the following steps. Referring now to FIGS. 7 and 9, battery power is applied to the hearing aid in step 902, and the potential of $V_{dd}$ begins to rise. The "RESET" input, which has $V_{bat}$ as its positive rail, is high at power up, but is made sensitive to the level of $V_{dd}$ such that "RESET" goes low when $V_{dd}$ reaches approximately 1.75 times $V_{bat}$. The "RESET" input is tied at node 716 to the set input of a flip flop 724, and the reset input of a counter 720. When "RESET" goes low at step 904, the counter 720, which has an output comprising the four high/low resistance setting signals begins increasing in count value. The counter 720 is in turn followed by a latch 722 which has an output comprising the same four high/low signals received by the counter as long as it is in an enabled state. The latch 722 is enabled by the output of the flip flop 724, which is high as long as its reset input, which is tied to node 714, is low. Latch 722 in turn outputs the four high/low signals to adjustable resistors 704 and 286, setting them to their highest value when the count is at zero, above the resistance of reference resistor 712. Because the resistance 704 (and consequently also resistance 286) is set at its upper limit above the resistance value of resistor 712, the voltage at node 714 is thus held at $V_{ss}$, and this low input is applied to the reset input of flip-flop 724.

The counter 720 has a clock signal of approximately 100 to 200 Hz as its second input, preferably generated by a simple RC stable multivibrator circuit which is not shown in the figures. Via node 718, the counter output steps up with each clock pulse, and the output of latch 722 likewise increases. As described at step 906, this causes the resistance value of resistors 286 and 704 to decrease until the resistance of resistor 704 falls just below the resistance of resistor 712 at step 908. At step 910 therefore, node 714 is pulled to $V_{bat}$, and this high potential is applied to the reset input of flip-flop 724, making its output go to $V_{ss}$, thereby disabling latch 722, which stores the value it had at the time node 714 went high. Feedback resistor 286 is therefore (along with resistor 704) made to match the resistance of external precision resistor 712.

Trimming the low signal baseline bias current of input transconductance amplifier 20 is done utilizing a similar procedure. A preferred circuit for implementing the bias current trim procedure is illustrated in FIG. 8 and is also outlined in the last three steps illustrated in the flowchart of FIG. 9.

Figure 8:
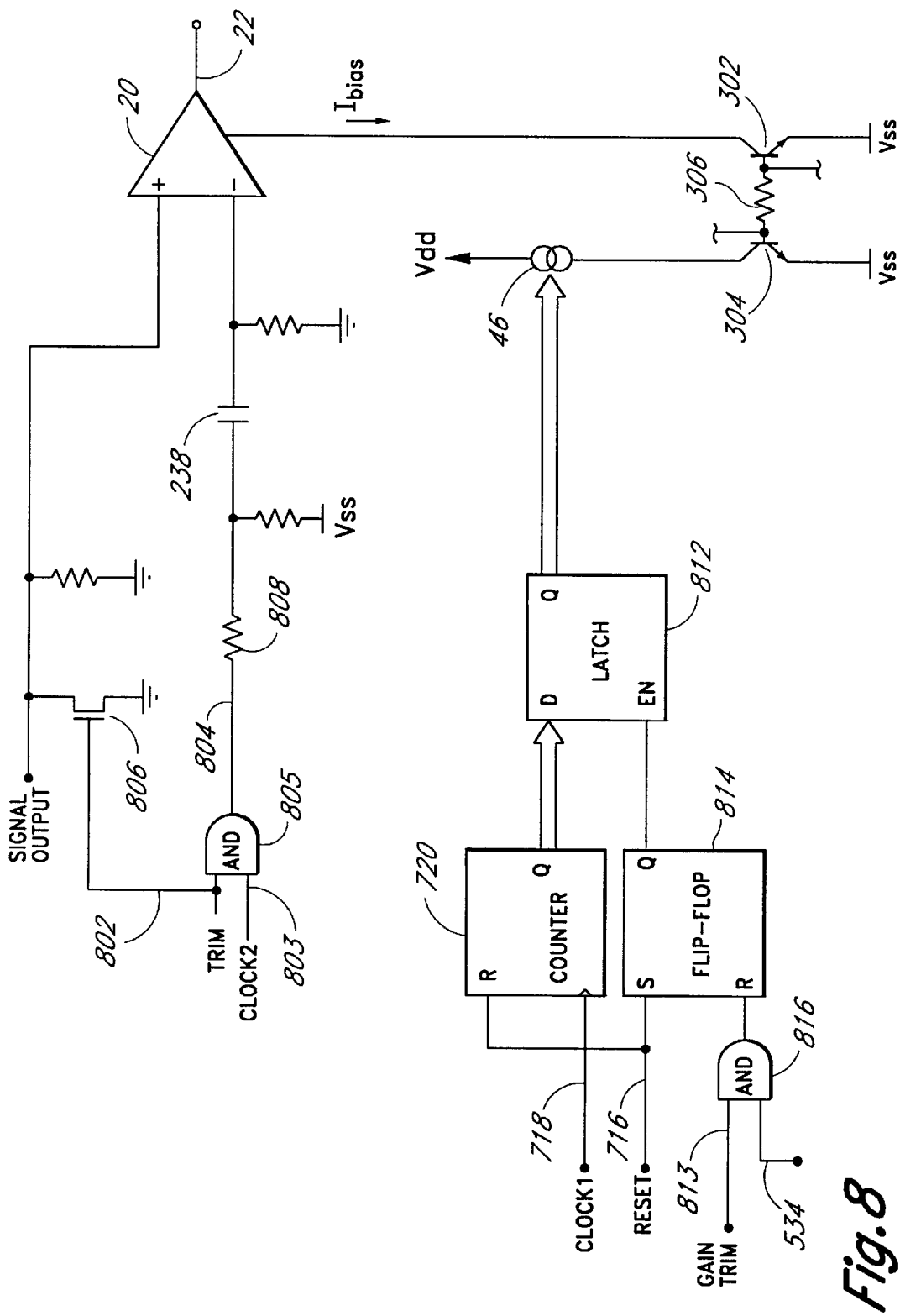
FIG. 8 is a block diagram showing a preferred circuit for trimming the gain of the input transconductance amplifier following hearing aid activation.

Referring now to FIGS. 8 and 9, the "TRIM" input at node 802, which has $V_{bat}$ as its positive rail, is high upon application of battery power. This turns on an n-channel MOSFET 806, tying the positive input of the transconductance amplifier 20 directly to signal ground. Both the "TRIM" input and an audio frequency clock signal of preferably approximately 1000 Hz are applied to an AND gate 805 having an output at node 804 which is applied to the negative input of transconductance amplifier 20 through resistor 808 and capacitor 810. The 1000 Hz clock is also preferably generated by a simple RC stable multivibrator circuit which is not shown in the figures. A high "TRIM" input therefore causes the 1000 Hz clock signal to appear at node 804, and provides a capacitively coupled signal to the negative input of transconductance amplifier 20. In a preferred embodiment therefore, the 1000 Hz clock signal is applied to the transconductance amplifier 20 while the resistor trimming sequence described above is performed, allowing the amplifier 20 output to stabilize before the bias current trimming operation is performed.

The bias current is then set in the following manner. The counter continues to increase in value after the resistor count latch 722 is disabled by the flip flop 724 at step 910 of FIG. 9. When the counter 720 wraps around to zero again at step 912, a "GAIN TRIM" signal at node 813 is forced high at step 912. The "GAIN TRIM" signal provides one input to an AND gate 816, which in turn provides an input to the RESET input of another flip flop 814. The flip flop 814 is interconnected with the "RESET" signal, the counter 720, and a count latch 812 in a manner analogous to that described above with respect to the feedback resistor 286 trim procedure. Therefore, the output of the flip flop 814 is high, and the latch 812 is enabled to follow the counter 720.

Current source 46, similar to resistors 286 and 704 described above, is made variable in 16 steps with four high/low inputs supplied by the counter 720 through latch 812. When the counter 720 and latch 812 pass through zero following the resistor trim procedure, variable current source 46 is sourcing its lowest level of current.

As was described above, the AND gate 816 has one input supplied by the "GAIN TRIM" signal, which goes high after one counter cycle of 16 steps. The second input to the AND gate 816 is the output of the comparison circuit 506, which is illustrated in FIG. 5a. The output of comparison circuit 506 goes high when the output of the current to voltage converter 26 exceeds a threshold defined by $V_{ref2}$. During normal operation, this results in bias current reduction by the current flow through current mirror 330 of FIG. 3. During the bias current trim operation, however, the compression enable transistor 336 is turned off, disabling the ability of current mirrors 320 and 330 to affect bias current flow to transconductance amplifier 20.

Therefore, as the outputs of the counter 720 and latch 812 again increase in value from zero, the bias current increases at step 914, thereby increasing the amplification of the clock signal applied at node 804. The output of the transconductance amplifier 20 at node 22 therefore increases until the output of the comparison circuit 506 goes high. At this point, illustrated as step 916 in FIG. 9, the input to AND gate 816 at node 818 which is tied to the output of comparison circuit 506 goes high, causing the output of AND gate 816 to go high, resetting flip-flop 814 and disabling latch 812. Thus, latch 812 stores the value it had when node 818 went high, and thereby sets a low signal bias current for the transconductance amplifier 20. When the clock 720 returns again to zero, the "TRIM" and "GAIN TRIM" inputs are forced low, the hearing aid gain is trimmed for normal operation.

The entire trimming operation takes 32 clock cycles of the low frequency clock at node 718 which drives the counter 720. For a counter clock frequency of 150 Hz, the trim cycle takes approximately 213 msec. Of course, it is preferable to have the output to the transducer disabled during the trimming procedure.

It is an aspect of the present invention that the low signal gain is set without reference to the voltage on the battery, which becomes reduced over time with hearing aid use. This is accomplished by the fact that the level of the clock signal applied at node 804 and the level of the reference voltage $V_{ref2}$ are both proportional to the existing battery voltage. Because the desired gain is defined by a desired ratio of $V_{ref2}$ to the reference input clock signal applied at node 804, repeatable gain trims are assured, even though the battery voltage at power up may vary. Of course, once the gain is set by the trim procedure, there is no continuous readjustment because trimming requires the input of a reference signal to the input amplifier 20. However, gain re-trimming is easily performed by turning the hearing aid off and reapplying power, which will automatically re-trim the gain consistent with the present battery voltage level.

The foregoing description details certain preferred embodiments of the present invention and describes the best mode contemplated. It will be appreciated, however, that no matter how detailed the foregoing appears in text, the invention can be practiced in many ways and the invention should be construed in accordance with the appended claims and any equivalents thereof.

What is claimed is:

1. A transconductance compression amplifier in a hearing aid comprising:
   an input stage comprising an amplifier with an input port for receiving an input signal, an output port for outputting a compressed output signal, and a gain defined by a bias current;
   a first current source supplying a first current to a circuit common;
   a second current source supplying said bias current to said amplifier, wherein said second current source supplies current in variable relation to the amount of current supplied by said first current source;
   and wherein said variable relation is dependent on the output signal level from said transconductance compression amplifier.

2. The amplifier of claim 1 wherein the current supplied by said first current source is periodically trimmed to establish the low signal gain of said amplifier.

3. The amplifier of claim 2 further comprising a battery power source, and wherein said trimming is automatically performed each time battery power is applied to said amplifier.

4. The amplifier of claim 2 wherein said hearing aid additionally comprises a battery power source, and wherein the current supplied by said first current source is varied upon the application of battery power to said hearing aid such that the low signal gain of said amplifier is substantially independent of the output voltage of said battery.

5. A method of trimming the gain of a compression amplifier of a hearing aid, said hearing aid comprising a battery power source and an input stage amplifier with gain defined by a bias current, said method comprising the steps of:
   applying an input signal to said amplifier, wherein said input signal level is substantially proportional to the output voltage of said battery power source;
   automatically increasing said bias current, thereby automatically increasing the gain of said amplifier;
   comparing the amplifier output signal produced by said input signal to a reference voltage, wherein said reference voltage is also substantially proportional to said battery voltage;
   determining a baseline bias current at which said output signal is substantially equal to said reference voltage;
   removing said input signal and maintaining said bias current substantially at said baseline level.

6. The method of claim 5 wherein said trimming method is automatically performed upon the application of battery power to said amplifier.

7. A compression amplifier for a hearing aid comprising:

a transconductance amplifier having its gain defined by a bias current, and which receives an input signal and provides an output signal with reduced dynamic range;

first and second bipolar transistors having common emitters connected to a circuit common, and wherein the bases of said first and second bipolar transistors are connected through a series resistor, and wherein the bias current of said transconductance amplifier provides an input to the collector of said first bipolar transistor;

a current source providing an input to the collector of said second bipolar transistor such that the bias current through said first bipolar resistor is determined by the current through said second bipolar transistor and the voltage drop across said series resistor;

a current sink having an input connected to the junction of said resistor and the base of said first bipolar transistor such that variations in current conducted by said current sink produce variations in the voltage drop across said resistor; and a transconductance amplifier output sensor which varies said current conducted by said current sink in response to said output signal of said transconductance amplifier, thereby producing a compression amplifier with a gain dependent on said output signal.

8. An analog hearing aid comprising:

a signal input stage comprising a variable gain transconductance amplifier having an output signal current defined by an input signal voltage and a variable bias current;

a current to voltage converter having as an input said output signal current;

a power amplifier having as an input the output of said current to voltage converter; and an output transducer having as an input the output of said power amplifier, wherein said bias current of said transconductance amplifier is reduced when an output voltage of said current to voltage converter exceeds a first reference voltage, and wherein said bias current of said transconductance amplifier is reduced when an output voltage of said power amplifier exceeds a second reference voltage.

* * * * *